US011381719B2

(12) United States Patent
Nakamura

(10) Patent No.: US 11,381,719 B2
(45) Date of Patent: Jul. 5, 2022

(54) IMAGING DEVICE

(71) Applicant: Nidec Copal Corporation, Tokyo (JP)

(72) Inventor: Yuta Nakamura, Tokyo (JP)

(73) Assignee: NIDEC COPAL CORPORATION, Tokyo (JP)

(*) Notice: Subject to any disclaimer, the term of this patent is extended or adjusted under 35 U.S.C. 154(b) by 203 days.

(21) Appl. No.: 16/644,499

(22) PCT Filed: Jul. 25, 2018

(86) PCT No.: PCT/JP2018/027799
§ 371 (c)(1),
(2) Date: Mar. 5, 2020

(87) PCT Pub. No.: WO2019/049537
PCT Pub. Date: Mar. 14, 2019

(65) Prior Publication Data
US 2021/0092271 A1 Mar. 25, 2021

(30) Foreign Application Priority Data
Sep. 6, 2017 (JP) .............................. JP2017-171430

(51) Int. Cl.
*H04N 5/225* (2006.01)
*G02B 7/02* (2021.01)
(Continued)

(52) U.S. Cl.
CPC .......... *H04N 5/22521* (2018.08); *G02B 7/02* (2013.01); *G03B 17/02* (2013.01); *H04N 5/2252* (2013.01);
(Continued)

(58) Field of Classification Search
CPC .......... G02B 7/02; G02B 7/026; G03B 17/02; G03B 30/00; H04N 5/2252;
(Continued)

(56) References Cited

U.S. PATENT DOCUMENTS

2008/0259200 A1* 10/2008 Matsumoto ........ H04N 5/22521
348/340
2011/0080515 A1* 4/2011 Kang .................... H04N 5/2257
348/374
(Continued)

FOREIGN PATENT DOCUMENTS

| JP | 2011-164461 A | 8/2011 |
| JP | 2011-259101 A | 12/2011 |
| JP | 2013-109188 A | 6/2013 |

OTHER PUBLICATIONS

International Search Report in PCT/JP2018/027799, dated Sep. 11, 2018. 4pp.

*Primary Examiner* — Amy R Hsu
(74) *Attorney, Agent, or Firm* — Hauptman Ham, LLP

(57) ABSTRACT

An imaging device includes an imaging unit that captures an image of a subject, a substrate on which the imaging unit is mounted, a lens barrel holding a lens, a shield plate surrounding the substrate and including a metal, and a case accommodating the substrate, the lens barrel, and the shield plate and including a metal. The shield plate is in contact with the case. The substrate includes a ground potential portion electrically connected to the shield plate and the case.

5 Claims, 4 Drawing Sheets

(51) Int. Cl.
*G03B 17/02* (2021.01)
*H05K 5/04* (2006.01)
*H05K 9/00* (2006.01)

(52) U.S. Cl.
CPC ......... *H04N 5/2253* (2013.01); *H04N 5/2254* (2013.01); *H05K 5/04* (2013.01); *H05K 9/0081* (2013.01)

(58) Field of Classification Search
CPC ............. H04N 5/22521; H04N 5/2253; H04N 5/2254; H05K 5/04; H05K 9/0081
See application file for complete search history.

(56) References Cited

U.S. PATENT DOCUMENTS

| | | | | |
|---|---|---|---|---|
| 2011/0199485 | A1* | 8/2011 | Nakamura | G02B 13/001 348/148 |
| 2011/0298925 | A1* | 12/2011 | Inoue | H04N 5/2254 348/148 |
| 2014/0218588 | A1* | 8/2014 | Ifuku | H04N 5/2171 348/340 |
| 2018/0261912 | A1* | 9/2018 | Mizuno | H01Q 1/3275 |

* cited by examiner

IMAGING DEVICE

RELATED APPLICATIONS

The present application is National Phase of International Application Number PCT/JP2018/027799, filed Jul. 25, 2018, and claims priority based on Japanese Patent Application No. 2017-171430, filed Sep. 6, 2017.

FIELD

An embodiment of the present invention relates to, for example, an imaging device.

BACKGROUND

Imaging devices known and used widely may include a case accommodating a lens barrel holding a lens and a substrate on which an image sensor is mounted. Such imaging devices are increasingly incorporated in vehicles or other equipment. Devices described in Patent Literatures 1 and 2 are examples of such techniques for imaging devices.

CITATION LIST

Patent Literature

Patent Literature 1: Japanese Unexamined Patent Application Publication No. 2011-164461
Patent Literature 2: Japanese Unexamined Patent Application Publication No. 2011-259101

BRIEF SUMMARY

Technical Problem

As imaging devices nowadays are incorporated in various pieces of equipment, such imaging devices are to reduce electromagnetic noise that may affect other components of the equipment on which the imaging devices are installed. However, such known imaging devices may have insufficient structures against electromagnetic noise.

Solution to Problem

In response to the above issue, one or more aspects of the present invention are directed to the structures described below. The reference numerals or other labels in parentheses herein denote the corresponding components in the figures to facilitate understanding of the aspects of the present invention. However, the components with such reference numerals do not limit the components according to the aspects of the present invention, which should be construed broadly within the scope technically understandable by those skilled in the art.

An imaging device according to one aspect of the present invention includes an imaging unit (511) that captures an image of a subject, a substrate (51, 52) on which the imaging unit is mounted, a lens barrel (1) holding a lens, a shield plate (6) surrounding the substrate and including a metal, and a case (3, 7) accommodating the substrate, the lens barrel, and the shield plate and including a metal. The shield plate (6) is in contact with the case (3, 7). The substrate includes a ground potential portion electrically connected (65a, 65b) to the shield plate and the case.

The imaging device with the above structure allows the shield plate and the case as well as the substrate to have a ground potential, thus enabling more effective shielding against electromagnetic noise from the substrate included in the imaging device than with known techniques. Moreover, the imaging device with the above structure has a large area of its metallic portions connected to the ground potential. The resultant electric circuit can be more resistant to noise such as surges of externally supplied electric power.

In the above imaging device, the shield plate may include a first leaf spring (65a, 65b) elastically in contact with the case, and the shield plate and the case may be electrically connected to each other with the first leaf spring between the shield plate and the case.

The imaging device with the above structure reduces the likelihood that the shield plate is disconnected from and electrically insulated from the case under a force such as an external impact or vibrations during operation. This structure stabilizes the ground potential of the imaging device.

In the above imaging device, the first leaf spring in contact with the case may urge the case along an optical axis.

The imaging device with the above structure allows the first leaf spring on the shield plate to be pressed against the case when assembled for example, thus allowing reliable electrical connection between the ground potential portions of the shield plate and the case.

In the above imaging device, the shield plate may have a flat surface perpendicular to the optical axis, and the first leaf spring may be located on the flat surface.

The imaging device with the above structure includes the leaf spring formed by, for example, partly machining the shield plate. This stabilizes the dimensions of the first leaf spring as well as the urging force applied to the case.

The above imaging device may further include a connector unit (74) electrically connected to the substrate. The connector unit may include a ground potential portion (74a) electrically connected to the shield plate (6).

The imaging device with the above structure uses the connector unit to allow electrical connection between a ground potential of an external device and the ground potential of the imaging device, further improving the shielding against electromagnetic noise. Moreover, the resultant electric circuit can be more resistant to noise.

In the above imaging device, the shield plate may include a second leaf spring (64) elastically in contact with the ground potential portion (74a) of the connector unit.

The imaging device with the above structure reduces the likelihood that the shield plate is disconnected from and electrically insulated from the connector unit under a force such as an external impact or vibrations during operation. This structure further stabilizes the ground potential of the imaging device.

DETAILED DESCRIPTION

Figure 1:
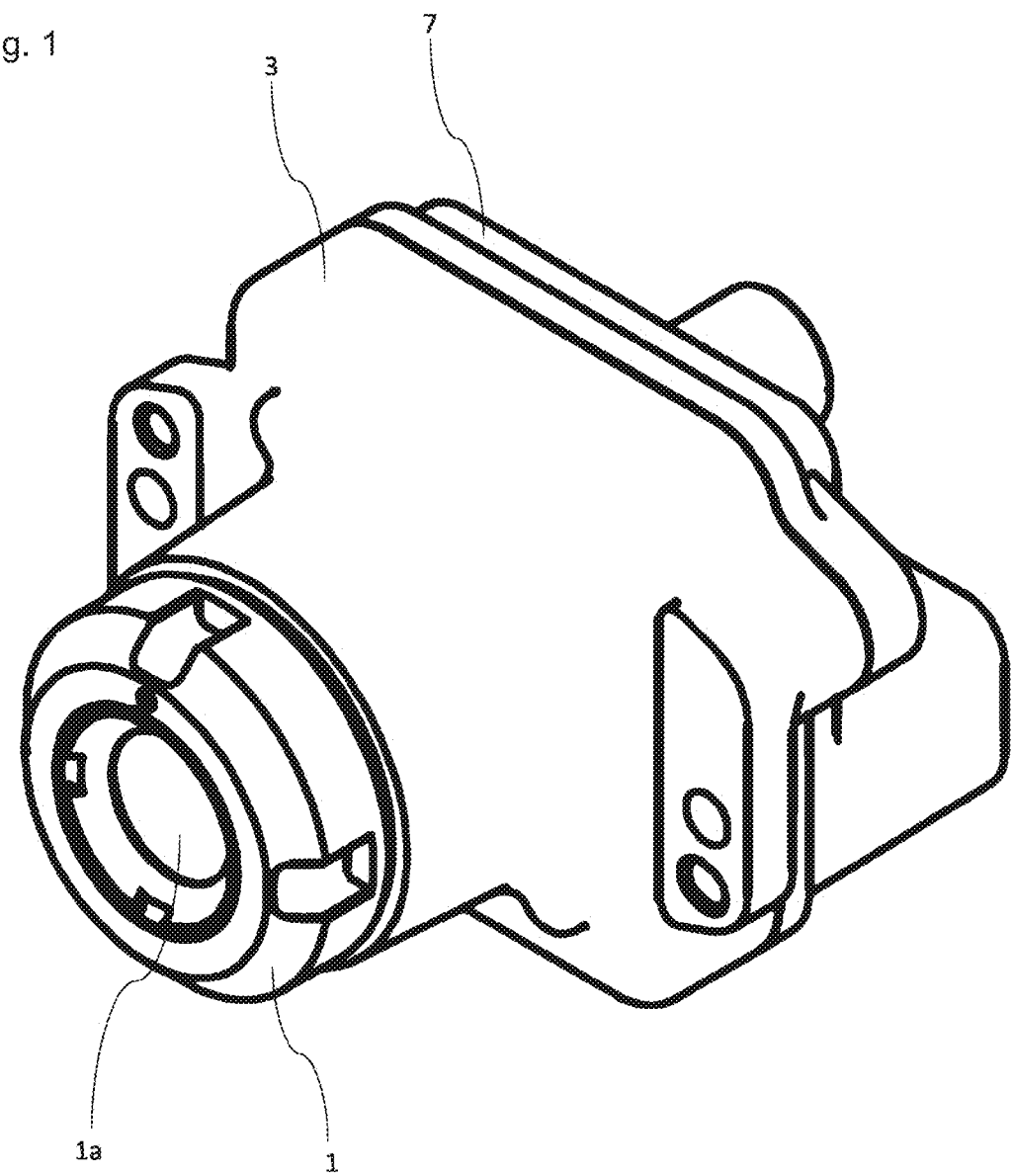
FIG. 1 is an external front perspective view of an imaging device.

An imaging device according to one embodiment of the present invention includes a case as well as a shield plate electrically connected to a ground potential of a substrate on which the imaging sensor is mounted. Specific examples of the structure according to the embodiment of the present invention will now be described. The embodiment described below is a mere example of the present invention, and should not be construed as limiting the technical scope of the invention. In the figures, the same components are given the same reference numerals, and may not be described.

1. Embodiment
2. Supplemental Examples

An optical axis herein refers to the center of a lens incorporated in the imaging device, and also the center of light entering the image sensor. An imaging target located opposite to the image sensor from the lens is herein referred to as a subject. The front or frontward in the optical axis direction refers to the direction in which the subject is located as viewed from the image sensor, whereas the rear or rearward in the optical axis direction refers to the direction in which the image sensor is located as viewed from the subject.

1. Embodiment

Figure 2:
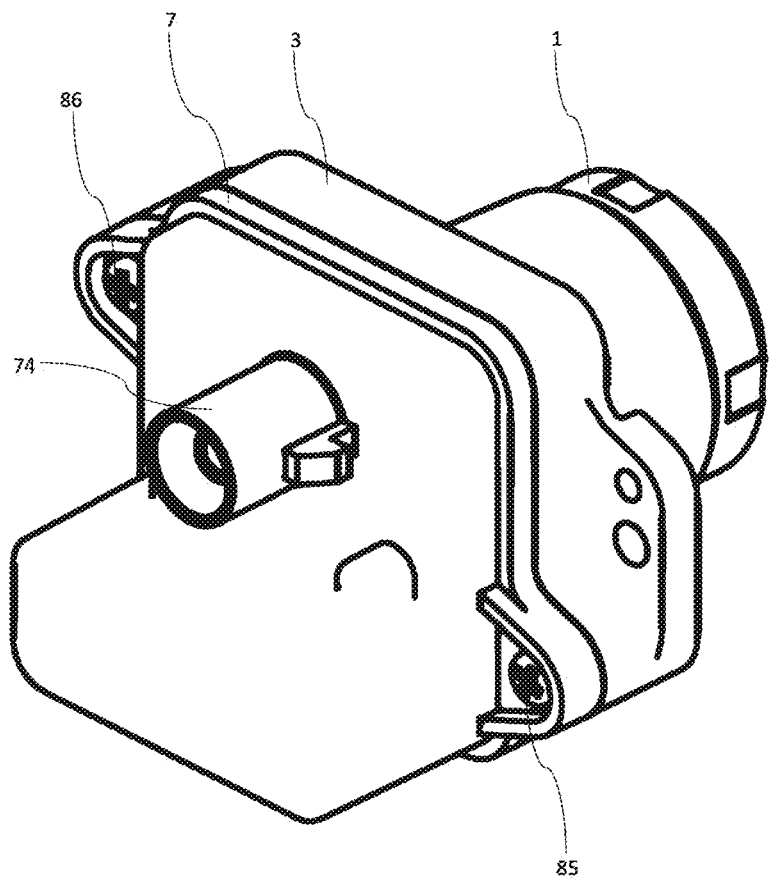
FIG. 2 is an external rear perspective view of the imaging device.
Figure 3:
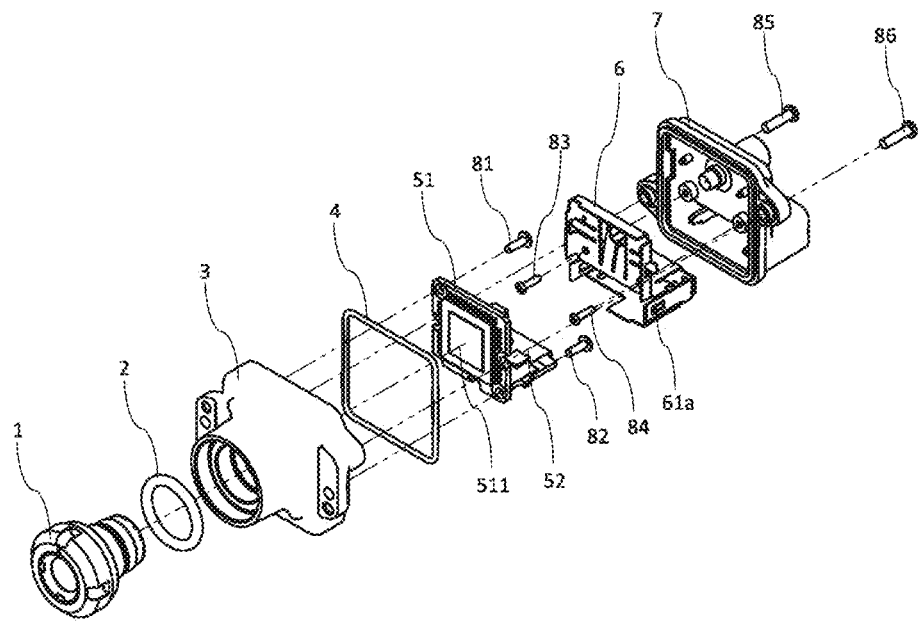
FIG. 3 is an exploded front perspective view of the imaging device.
Figure 4:
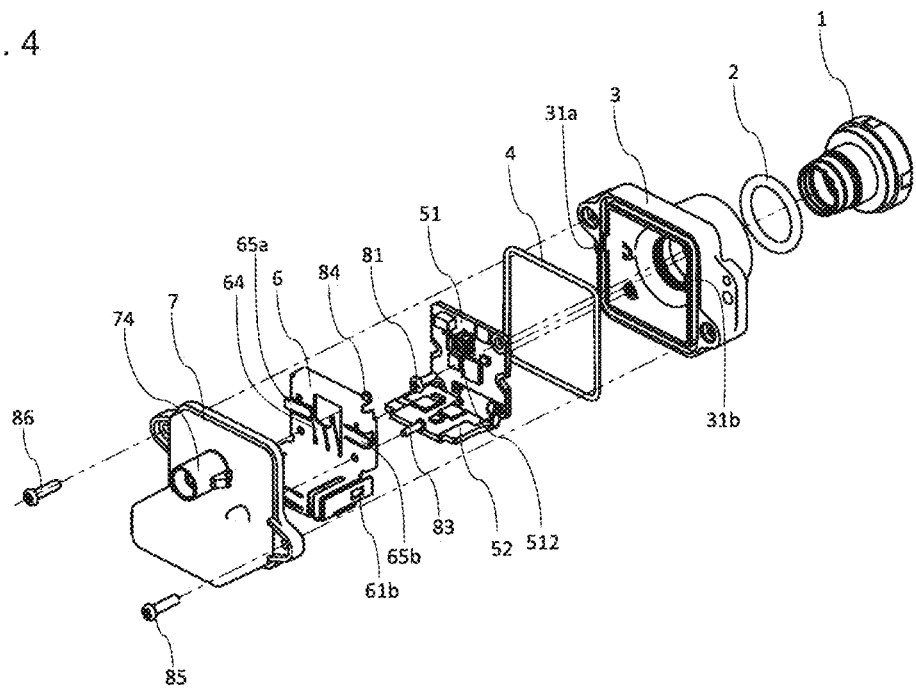
FIG. 4 is an exploded rear perspective view of the imaging device.
Figure 5:
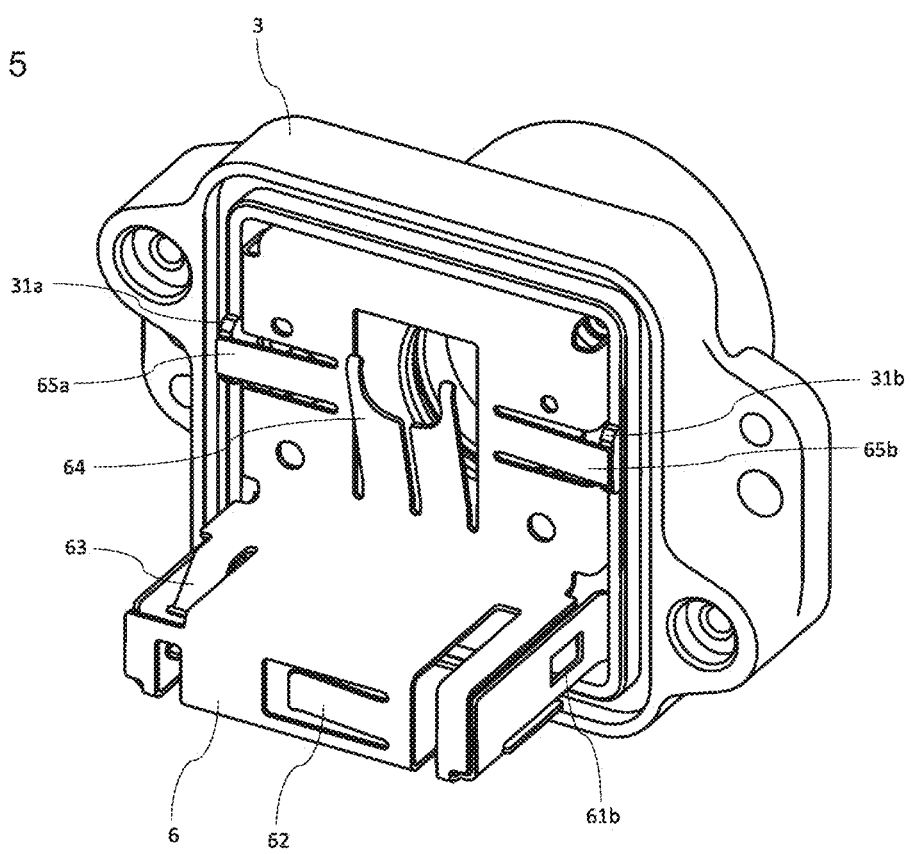
FIG. 5 is a rear perspective view of a front case and a shield plate connected to each other.
Figure 6:
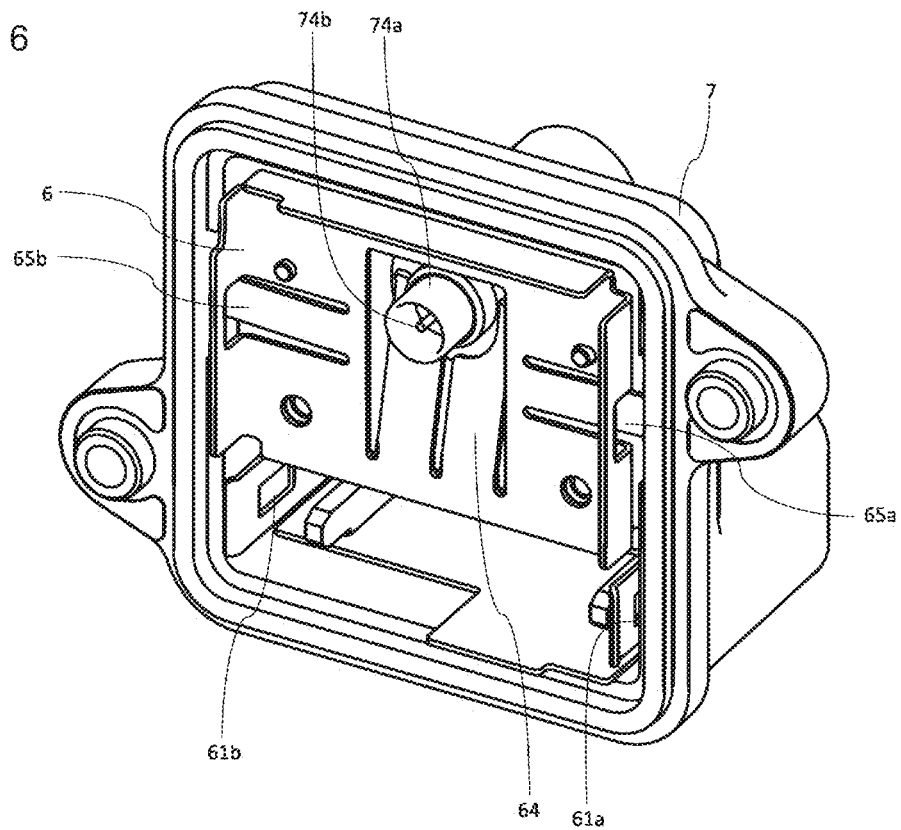
FIG. 6 is a front perspective view of a rear case and the shield plate connected to each other.

An embodiment of the present invention will be described with reference to the drawings. FIGS. 1 and 2 are external views of an imaging device. FIG. 1 is a front view, and FIG. 2 is a rear view. FIGS. 3 and 4 are exploded perspective views of the imaging device. FIG. 3 is a front view, and FIG. 4 is a rear view. FIG. 5 is a rear perspective view of a front case 3 and a shield plate 6 connected to each other. FIG. 6 is a front perspective view of a rear case 7 and the shield plate 6 connected to each other.

As illustrated, the imaging device according to the present embodiment includes a lens barrel 1, a waterproof seal 2, the front case 3, a waterproof seal 4, a first substrate 51, a second substrate 52, the shield plate 6, and the rear case 7. Although the first substrate 51 and the second substrate 52 as separate members are used in this embodiment, a single substrate may be used.

Front Case 3

The front case 3 forms a housing (case) accommodating the imaging device, together with the rear case 7. The front case 3 is formed from, for example, a conductive metal. The front case 3 may be formed from any electric conductor other than a metal, as easily conceivable by those skilled in the art. The front case 3 has an opening at the front in the optical axis direction, with the optical axis at the center. The front case 3 has, at the rear in the optical axis direction, an opening for connection to the rear case 7. The front case 3 has substantially rectangular circumferential surfaces to cover the optical axis. The front case 3 is connected to the rear case 7 to define an internal space for accommodating the lens barrel 1, the first substrate 51, the second substrate 52, the shield plate 6, and other components. As shown in FIG. 1, the opening at the front in the optical axis direction in the front case 3 receives a lens 1a held in the lens barrel 1.

Figure 7:
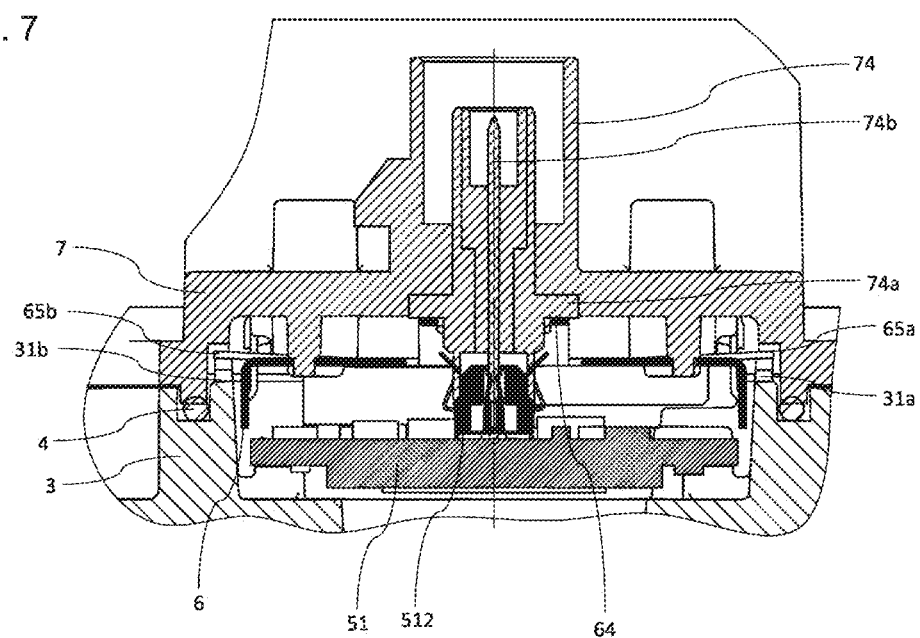
FIG. 7 is an enlarged cross-sectional view of the features of the imaging device.

As shown in FIGS. 4, 5, and 7, the front case 3 includes protrusions 31a and 31b protruding rearward in the optical axis direction. The protrusions 31a and 31b are located adjacent to the outer edges of the front case 3. The protrusions 31a and 31b are respectively in contact with first leaf springs 65a and 65b on the shield plate 6. Like the other part of the front case 3, the protrusions 31a and 31b are formed from, for example, a conductive metal. The protrusions 31a and 31b are in contact with the shield plate 6 to cause the entire front case 3 to have a ground potential, similarly to the shield plate 6.

Rear Case 7

As described above, the rear case 7 is connected to the front case 3 to define the space for accommodating the lens barrel 1, the first substrate 51, the second substrate 52, the shield plate 6, and other components. The rear case 7 is shaped in conformance with the shield plate 6. The rear case 7 has, at the rear in the optical axis direction, a surface substantially perpendicular to the optical axis, from which substantially rectangular peripheral surfaces of the rear case 7 extend frontward in the optical axis direction to cover the optical axis. The rear case 7 further has a portion extending rearward from the surface in the optical axis direction in conformance with the contour of the shield plate 6. The rear case 7 has, at the front in the optical axis direction, substantially the same shape as the front case 3 at the rear in the optical axis direction. When assembled, the rear case 7 is connected to the front case 3 with connection screws 85 and 86. The waterproof seal 4 is placed between the rear case 7 and the front case 3.

The rear case 7 includes, at the rear in the optical axis direction, a connector unit 74 for connecting a connector 512 on the first substrate 51 to an external device. The connector unit 74 is a cylinder protruding frontward in the optical axis direction. As shown in FIGS. 6 and 7, the connector unit 74 includes a ground potential portion 74a and a signal line 74b. The ground potential portion 74a is an outer cylindrical portion of the connector unit 74. The signal line 74b is located at the center of the connector unit 74. The connector unit 74 is connected to an external device with, for example, a cable (not shown) as appropriate. The ground potential portion 74a is electrically connected to a ground potential of the external device. The signal line 74b is electrically connected to the external device to transmit a signal output from the first substrate 51 to the external device. The signal line 74b may also transmit a signal from the external device to the first substrate 51. The ground potential portion 74a of the connector unit 74 is in contact with a second leaf spring 64 included in the shield plate 6.

Lens Barrel 1

The lens barrel 1 is a cylinder elongated along the optical axis and holds one or more optical members including the lens 1a. The optical members held in the lens barrel 1 include, for example, a lens, a spacer, aperture blades, and an optical filter, in addition to the lens 1a. The lenses including the lens 1a are formed from a transparent material, such as glass or plastic, to transmit light from the front to the rear in the optical axis direction while refracting the light. The spacer is an annular plate with an appropriate thickness in the optical axis direction. The spacer adjusts the positions of the lenses in the optical axis direction. The spacer has an opening in the middle including the optical axis. The aperture blades determine the outermost position of passing light. The optical filter prevents or blocks passage of light with a predetermined wavelength. The optical filter may include, for example, an infrared cut-off filter that prevents infrared rays from passing. The number of optical members used can be changed as appropriate.

Waterproof Seal 2

The waterproof seal 2 is annular, and is formed from an elastic material, such as rubber. The waterproof seal 2 is placed between the front case 3 and the lens barrel 1 to connect the front case 3 to the lens barrel 1 with no gap between them. The waterproof seal 2 is annular in conformance with the outer rim of the opening of the front case 3.

Waterproof Seal 4

The waterproof seal 4 is rectangular, and is formed from an elastic material, such as rubber. The waterproof seal 4 is placed between the front case 3 and the rear case 7 to connect the front case 3 to the rear case 7 with no gap between them. The waterproof seal 4 is rectangular in conformance with the contour of the open rectangular rear of the front case 3 and with the open rectangular front of the rear case 7 in the optical axis direction.

The rear opening of the front case 3 and the front opening of the rear case 7 in the optical axis direction and the waterproof seal 4 may not be rectangular and may be, for example, circular or polygonal.

First Substrate 51

The first substrate 51 is a rigid substrate on which an image sensor 511 is mounted. The first substrate 51 may receive an electronic component other than the image sensor 511. The first substrate 51 has a rear surface in the optical axis direction on which a connector 512 is mounted. The first substrate 51 has a front surface in the optical axis direction on which the image sensor 511 is mounted. The first substrate 51 is placed on a flat surface perpendicular to the optical axis to allow light to enter the image sensor 511 during image capturing. The first substrate 51 and the second substrate 52 are electrically connected with, for example, a flexible substrate (not shown). Electrical signals obtained by the image sensor 511 undergo predetermined electric or signal processing performed by the electronic components on the first substrate 51 and the second substrate 52. The processed signals are then output from the connector 512 through the signal line 74b included in the connector unit 74 in the rear case 7 to a device external to the imaging device as image data. The first substrate 51 is connected and secured in position to the front case 3 with connection screws 81 and 82.

The image sensor 511 is a photoelectric converter that converts incident light to electrical signals. The image sensor 511 is, for example, a complementary metal-oxide-semiconductor (CMOS) sensor or a charge-coupled device (CCD), but is not limited to such devices. The imaging device may include an imaging unit having the imaging function other than the image sensor 511. The image sensor is an example of an imaging unit in an aspect of the invention.

Second Substrate 52

The second substrate 52 is a rigid substrate on which an electronic component is mounted. The second substrate 52 is parallel to the optical axis, and extends in the direction perpendicular to the first substrate 51. The second substrate 52 arranged in this manner can avoid interfering with the connector 512 and the connector unit 74. The imaging device with the above structure has a partly shorter length (thickness) in the optical axis direction than the structure including the first substrate 51 and the second substrate 52 both perpendicular to the optical axis.

The second substrate 52 includes protrusions protruding outwardly from its outer peripheries with respect to the optical axis. These protrusions each are received in a fitting portion 61a or 61b to allow the second substrate 52 to be fitted with the shield plate 6. The second substrate 52 receives an urging force from a leaf spring 62 included in the shield plate 6 applied frontward in the optical axis direction, and also receives an urging force from a leaf spring 63 applied in the direction perpendicular to the optical axis. The second substrate 52 under the urging forces from the leaf springs 62 and 63 applied in such different directions is held in a stable manner with respect to the shield plate 6 and the rear case 7.

Shield Plate 6

The shield plate 6 is a plate of, for example, conductive metal. When assembled, the shield plate 6 covers the first substrate 51 and the second substrate 52. More specifically, the shield plate 6 includes a first box-shaped portion and a second box-shaped portion each having an opening at the front in the optical axis direction. The first box-shaped portion surrounds the first substrate 51. The second box-shaped portion surrounds the second substrate 52. The front openings in the optical axis direction receive the first substrate 51 and the second substrate 52 during the assembly. The shield plate 6 is connected to the rear case 7 with connection screws 83 and 84.

As shown in FIGS. 3 to 7, the shield plate 6 includes the fitting portions 61a and 61b, the leaf spring 62, the leaf spring 63, the second leaf spring 64, and the first leaf springs 65a and 65b. The fitting portions 61a and 61b are through-holes at positions in correspondence with the protrusions on the second substrate 52. When assembled, the fitting portions 61a and 61b receive the corresponding protrusions on the second substrate 52. The leaf spring 62 urges the second substrate 52 frontward in the optical axis direction and the leaf spring 63 in the direction perpendicular to the optical axis to hold the second substrate 52.

The first leaf springs 65a and 65b are located on a flat surface of the shield plate 6 substantially perpendicular to the optical axis. The first leaf springs 65a and 65b on the shield plate 6 are plates extending in the direction substantially perpendicular to the optical axis. The first leaf springs 65a and 65b are in contact with and urge the corresponding protrusions 31a and 31b on the front case 3 frontward in the optical axis direction. This allows the entire shield plate 6 and the entire front case 3 to be electrically connected to each other and have a ground potential.

The second leaf spring 64 is in contact with and urges, rearward in the optical axis direction, a conductive portion on the circumference of the cylindrical portion of the ground potential portion 74a of the connector unit 74. The shield plate 6 is thus electrically connected, with the ground potential portion 74a of the connector unit 74, to the first substrate 51, the second substrate 52, and a ground potential of an external device.

The shield plate 6 and the second substrate 52 may be electrically connected to each other with the leaf spring 62 or 63 in the shield plate 6.

In the imaging device according to the present embodiment, the ground potential of the first substrate 51 and the second substrate 52 is electrically connected to the shield plate 6 and the front case 3, causing the entire shield plate 6 and the entire front case 3 to have the ground potential. The imaging device according to the present embodiment enables more effective shielding against electromagnetic noise from the substrate (the first substrate 51 and the second substrate 52) included in the imaging device than with known techniques. Moreover, the imaging device with the above structure has a large area of its metallic portions connected to the ground potential. The resultant electric circuit can be more resistant to noise such as surges of externally supplied electric power.

In the imaging device according to the present embodiment, the first leaf springs 65a and 65b allow the shield plate 6 to be elastically in contact with the front case 3. This reduces the likelihood that the shield plate 6 is disconnected from and electrically insulated from the front case 3 when the imaging device receives a force such as an external impact or vibrations during operation. This structure stabilizes the ground potential of the imaging device.

In the imaging device according to the present embodiment, the first leaf springs 65a and 65b on the shield plate 6 are in contact with and urge the front case 3 in the optical axis direction. The first leaf springs 65a and 65b on the shield plate 6 are thus pressed against the front case 3 when assembled for example, thus allowing reliable electrical connection between the ground potential portions of the shield plate 6 and the front case 3.

In the imaging device according to the present embodiment, the first leaf springs 65a and 65b are located on the flat surface of the shield plate 6 perpendicular to the optical axis. The leaf springs may thus be formed by, for example, partly machining the shield plate. This stabilizes the dimensions of the first leaf springs as well as the urging force applied to the case.

In the imaging device according to the present embodiment, the ground potential portion 74a of the connector unit 74 is electrically connected to the shield plate 6 with the second leaf spring 64. This allows electrical connection between a ground potential of an external device and the ground potential of the imaging device, further improving the shielding against electromagnetic noise. Moreover, the resultant electric circuit can be more resistant to noise.

In the imaging device according to the present embodiment, the second leaf spring 64 on the shield plate 6 is elastically in contact with the ground potential portion 74a of the connector unit 74. This reduces the likelihood that the shield plate 6 is disconnected from and electrically insulated from the connector unit 74 when the imaging device receives a force such as an external impact or vibrations during operation. This structure further stabilizes the ground potential of the imaging device.

2. Supplemental Examples

The embodiment of the present invention has been described specifically. The embodiment described above is a mere example. The scope of the present invention is not limited to the embodiment, but is construed broadly within the scope understandable by those skilled in the art.

For example, the imaging device according to the above embodiment includes the front case 3 and the rear case 7. However, the imaging device may have any other structure that includes a case as a housing. Instead of the front case 3, the rear case 7 may have an outer surface portion formed from a conductive metal to be connected to a ground potential. However, the rear case 7 includes the connector unit 74 with the signal line 74b and the ground potential portion 74a electrically insulated from each other. In this case, for example, the shield plate 6 is elastically in contact with the rear case 7.

The imaging device according to the above embodiment includes two rigid substrates, the first substrate 51 and the second substrate 52. However, the imaging device may include more rigid substrates or may simply include a single rigid substrate. Flexible substrates may be used in place of such rigid substrates.

INDUSTRIAL APPLICABILITY

The imaging device according to at least one embodiment of the present invention may be suitably used for an in-vehicle imaging device.

The invention claimed is:

1. An imaging device, comprising:
   an imaging unit configured to capture an image of a subject;
   a substrate on which the imaging unit is mounted;
   a lens barrel holding a lens;
   a shield plate surrounding the substrate, the shield plate comprising a metal; and
   a case accommodating the substrate, the lens barrel, and the shield plate, the case comprising a metal,
   wherein the shield plate is in contact with the case,
   the substrate includes a ground potential portion electrically connected to the shield plate and the case,
   the shield plate includes a first leaf spring elastically in contact with the case, and
   the shield plate and the case are electrically connected to each other with the first leaf spring between the shield plate and the case.

2. The imaging device according to claim 1, wherein the first leaf spring in contact with the case urges the case in an optical axis direction.

3. The imaging device according to claim 1, wherein the shield plate has a flat surface perpendicular to the optical axis, and
   the first leaf spring is located on the flat surface.

4. The imaging device according to claim 1, further comprising:
   a connector unit electrically connected to the substrate,
   wherein the connector unit includes a ground potential portion electrically connected to the shield plate.

5. The imaging device according to claim 4, wherein the shield plate includes a second leaf spring elastically in contact with the ground potential portion of the connector unit.

* * * * *